(12) United States Patent
Fornara et al.

(10) Patent No.: US 11,367,720 B2
(45) Date of Patent: Jun. 21, 2022

(54) METHOD FOR PROTECTING AN INTEGRATED CIRCUIT MODULE USING AN ANTIFUSE, AND CORRESPONDING DEVICE

(71) Applicant: STMicroelectronics (Rousset) SAS, Rousset (FR)

(72) Inventors: Pascal Fornara, Pourrieres (FR); Fabrice Marinet, Chateauneuf le Rouge (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 276 days.

(21) Appl. No.: 16/518,436

(22) Filed: Jul. 22, 2019

(65) Prior Publication Data
US 2020/0035671 A1    Jan. 30, 2020

(30) Foreign Application Priority Data

Jul. 25, 2018 (FR) ...................................... 1856887

(51) Int. Cl.
*H01L 27/02*  (2006.01)
*H01L 23/525*  (2006.01)

(52) U.S. Cl.
CPC ...... *H01L 27/0292* (2013.01); *H01L 23/5252* (2013.01)

(58) Field of Classification Search
CPC  H01L 27/0292; H01L 23/5252; H01L 23/522
USPC ....................................................... 257/530
See application file for complete search history.

(56) References Cited

U.S. PATENT DOCUMENTS

| | | | |
|---|---|---|---|
| 6,856,581 B1 | 2/2005 | Berstis et al. | |
| 8,022,460 B2 | 9/2011 | Yamazaki et al. | |
| 8,304,313 B2 | 11/2012 | Tanaka et al. | |
| 8,378,710 B1 | 2/2013 | Al-Kadi et al. | |
| 8,729,668 B2 | 5/2014 | Fornara et al. | |
| 9,025,373 B2 | 5/2015 | Tatsumura et al. | |
| 2005/0104161 A1* | 5/2005 | Matsuno | H01L 23/576 257/620 |
| 2005/0201158 A1 | 9/2005 | Rosa | |

(Continued)

FOREIGN PATENT DOCUMENTS

| | | | | |
|---|---|---|---|---|
| EP | 1293988 A2 | 3/2003 | | |
| EP | 1400887 A1 * | 3/2004 | ............. | G06F 21/87 |

(Continued)

OTHER PUBLICATIONS

INPI Search Report and Written Opinion for FR 1856887 dated Apr. 3, 2019 (10 pages).

*Primary Examiner* — Matthew E. Gordon
(74) *Attorney, Agent, or Firm* — Crowe & Dunlevy

(57) ABSTRACT

An integrated circuit includes a circuit module storing sensitive data. An electrically conductive body at a floating potential is located in the integrated circuit and holds an initial amount of electric charge. In response to an attack attempting to access the sensitive data, electric charge is collected on the electrically conductive body. A protection circuit is configured to ground an output of the circuit module, and thus preclude access to the sensitive data, in response to collected amount of electric charge on the electrically conductive body differing from the initial amount and exceeding a threshold.

24 Claims, 3 Drawing Sheets

(56) References Cited

U.S. PATENT DOCUMENTS

| | | |
|---|---|---|
| 2006/0028340 A1 | 2/2006 | Hooghan et al. |
| 2006/0090211 A1* | 4/2006 | Stidl .................. G06F 21/86 |
| | | 726/34 |
| 2013/0032926 A1* | 2/2013 | Fornara ............ H01L 27/11531 |
| | | 257/538 |
| 2013/0134499 A1 | 5/2013 | Tatsumura et al. |
| 2013/0193437 A1 | 8/2013 | Lisart et al. |
| 2013/0314121 A1 | 11/2013 | Mougin et al. |
| 2014/0375303 A1 | 12/2014 | Helfmeier et al. |
| 2016/0042199 A1 | 2/2016 | Joharapurkar et al. |
| 2016/0328578 A1 | 11/2016 | Plusquellic et al. |
| 2020/0035624 A1 | 1/2020 | Marinet et al. |

FOREIGN PATENT DOCUMENTS

| | | | |
|---|---|---|---|
| EP | 1400887 A1 | 3/2004 | |
| EP | 2680184 A1 | 1/2014 | |
| FR | 2938953 A1 | 5/2010 | |
| FR | 2985059 A1 * | 6/2013 | ............. G06F 21/77 |
| FR | 2985059 A1 | 6/2013 | |

\* cited by examiner

METHOD FOR PROTECTING AN INTEGRATED CIRCUIT MODULE USING AN ANTIFUSE, AND CORRESPONDING DEVICE

PRIORITY CLAIM

This application claims the priority benefit of French Application for Patent No. 1856887, filed on Jul. 25, 2018, the content of which is hereby incorporated by reference in its entirety to the maximum extent allowable by law.

TECHNICAL FIELD

Embodiments and implementations relate to integrated circuits, in particular to the protection thereof, more particularly during a potential attempt to breach the integrity of the integrated circuit, for example through an attack carried out by means of a focused ion beam (FIB) of positively charged particles or through negatively charged particles, such as electrons in the context of scanning electron microscopy (SEM).

BACKGROUND

Integrated circuits, in particular those provided with memories containing sensitive information, have to be protected to the greatest possible extent from attacks, in particular from attacks aiming to uncover stored data.

Among the possible attacks for extracting confidential data from a memory or from a module of an integrated circuit, for example a protected memory of a chip card, attacks by locally modifying the circuit by means of a focused ion beam may be cited.

Some solutions make it possible to detect the opening of the integrated circuit based on variations in transistor leakage currents. However, this type of solution is difficult to implement.

There is therefore a need to provide a new method for protecting integrated circuits, especially from this type of attack, and in particular a module containing sensitive data.

SUMMARY

According to one implementation and embodiment, it is proposed to meet this need by means of a straightforward solution based not on variations in transistor leakage currents but rather on the use of antifuse devices.

According to one aspect, what is proposed is a method for protecting a module within an integrated circuit, comprising: producing, in the integrated circuit, an electrically conductive body at a floating potential and holding an initial amount of electric charge; and grounding an output of the module in the presence of an amount of electric charge on said body that is different from said initial amount and higher than a threshold.

The term "module" should be understood very broadly, including in particular a memory, and more generally a data storage circuit, or else an electronic circuit having a determined function in the integrated circuit, for example, but not exclusively, an amplifier or filter function.

An electrically conductive body at a floating potential makes it possible to collect electric charge during an attack, for example by ion or electron beams. If the amount of electric charge is higher than the threshold, said output of the module will be grounded. Thus, it will not be possible to retrieve the information processed or stored by the module and the module is protected.

The threshold depends in particular on the circuit used to ground the output of the module. Thus, if an antifuse device is used, a threshold value corresponding to a breakdown voltage of the antifuse device could be chosen.

This threshold will generally allow the circuit allowing the output of the module to be grounded to be activated or triggered. A person skilled in the art will be able to choose the value of the threshold according to the structure and the operation of said circuit, in particular its trigger threshold.

Although the initial charge state may take any value, it is simpler for the initial charge amount to be zero.

To this end, according to one implementation, the production of the body at a floating potential comprises grounding said body via a connecting element during the production of the integrated circuit then cutting through the connecting element so as to confer a zero initial amount of charge on said body.

The body at a floating potential is thus grounded during the production of the integrated circuit in order to shed charge and to provide it with a discharged initial state before any potential attack.

According to one implementation, the method comprises an electrically conductive coupling from a terminal of an antifuse device to said body, said antifuse device being configured to transition irreversibly from a first state corresponding to an open circuit to a second state corresponding to a closed circuit if the voltage applied to said terminal and resulting from said amount of charge that is higher than said threshold is higher than a breakdown voltage of said antifuse device, the transitioning of the antifuse device from the first state to the second state then comprises the formation, within the antifuse device, of a permanent electrically conductive path connecting said output of said module to ground.

If a voltage resulting from the buildup of charge on said body is applied to the antifuse device and if said voltage is higher than the breakdown voltage of said device, the antifuse device changes state. Thus, the device that is coupled to ground but configured in an initial off state then becomes conductive, thus allowing the data present at the output of the module to be transmitted to ground and thus the module to be protected.

According to another aspect, what is proposed is an integrated circuit comprising a module, an electrically conductive body at a floating potential that is located in the integrated circuit and holds an initial amount of electric charge, and a protection circuit that is configured to ground an output of the module in the presence of an amount of electric charge on said body that is different from the initial amount and higher than a threshold.

According to one embodiment, the body is configured to hold a zero initial amount of charge.

According to one embodiment, the integrated circuit comprises an electrically conductive connecting element having a first end that is coupled to said body and a second, free end that is located outside the integrated circuit.

According to one embodiment, the integrated circuit comprises at least one sealing ring, and said connecting element passes through said at least one sealing ring, the free end of the connecting element being located outside said at least one sealing ring.

According to one embodiment, the protection circuit comprises an antifuse device having a terminal that is electrically coupled to said body, said antifuse device being configured to transition irreversibly from a first state corresponding to an open circuit to a second state corresponding to a closed circuit if the voltage applied to said terminal and resulting from said amount of charge that is higher than said threshold is higher than a breakdown voltage of said antifuse device, the antifuse device being configured to form a permanent electrically conductive path within the antifuse device connecting the output of the module to ground if the antifuse device transitions from the first state to the second state.

According to one embodiment, the antifuse device includes, on a substrate, a first layer of polycrystalline silicon and a second layer of polycrystalline silicon that are separated by a dielectric layer having a portion that is thinned with respect to the rest of the dielectric layer, the second layer of polycrystalline silicon including said terminal that is electrically coupled to said body.

When the voltage applied to said terminal is higher than the breakdown voltage of said antifuse device, the dielectric layer becomes conductive at the site of its thinned portion and thus a permanent conductive path is formed between the first layer of polycrystalline silicon and the second layer of polycrystalline silicon. Consequently, the antifuse device connects the output of the module to ground.

According to one embodiment, the body comprises an electrically conductive wafer.

The electrically conductive wafer allows a larger area to be occupied and electron beams to be received at multiple sites. The wafer is therefore more sensitive to an electron beam attack.

Also proposed is an electronic device such as a chip card including the integrated circuit defined above.

BRIEF DESCRIPTION OF THE DRAWINGS

Other advantages and features of the invention will become apparent upon examining the detailed description of completely non-limiting embodiments and implementations of the invention and the appended drawings, in which.

DETAILED DESCRIPTION

Figure 1:
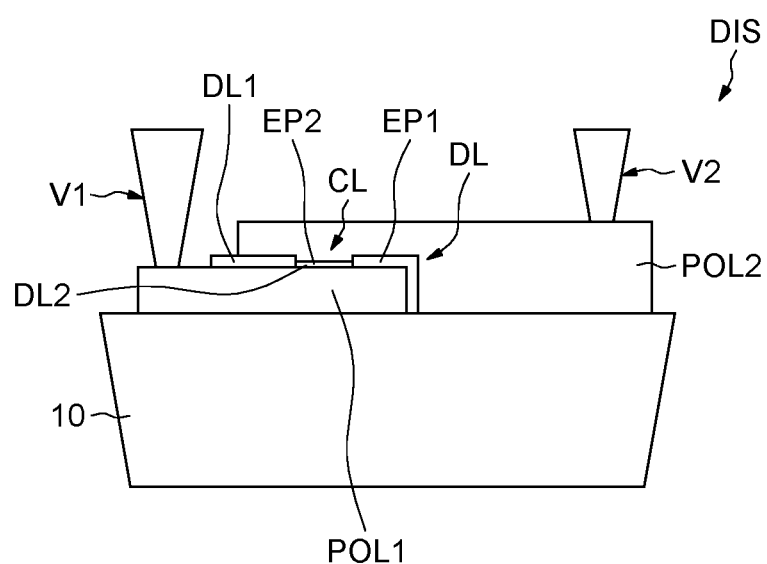
FIG. 1 shows an example of an integrated antifuse device.

FIG. 1 shows an example of an integrated antifuse device DIS formed on an isolation region 10 of a substrate, of shallow trench isolation (STI) or local oxide (LOCOS for local oxidation of silicon) type.

A first layer of heavily n-doped polycrystalline silicon POL1 is covered on the right-hand side by a dielectric layer DL, for example a silicon oxide layer or an oxide-nitride-oxide layer, known to those skilled in the art by the acronym ONO.

The dielectric layer DL comprises a first portion DL1, the thickness EP1 of which is between 100 Å and 200 Å and a second portion DL2 that is thinned with respect to the rest of the dielectric layer DL, the thickness EP2 of which is between 15 Å and 30 Å.

The dielectric layer DL is at least partly covered by a second layer of polycrystalline silicon POL2, which is preferably heavily n-doped.

The antifuse device DIS also comprises two conductive vias V1 and V2 allowing terminals to be accessed. More specifically, the conductive via V1 allows access to a contact on the first layer of polycrystalline silicon POL1 and the conductive via V2 allows access to a contact on the second layer of polycrystalline silicon POL2.

If a voltage is applied to the second layer of polycrystalline silicon POL2 through the via V2 forming a control terminal V2, and if said voltage is higher than a breakdown voltage CL of said antifuse device, which may be between 3 V and 7 V for a 90 nm technology node, then said dielectric layer DL becomes conductive at the site of the thinned portion DL2, thus forming a permanent conductive path between the first layer of polycrystalline silicon POL1 and the second layer of polycrystalline silicon POL2.

Figure 2:
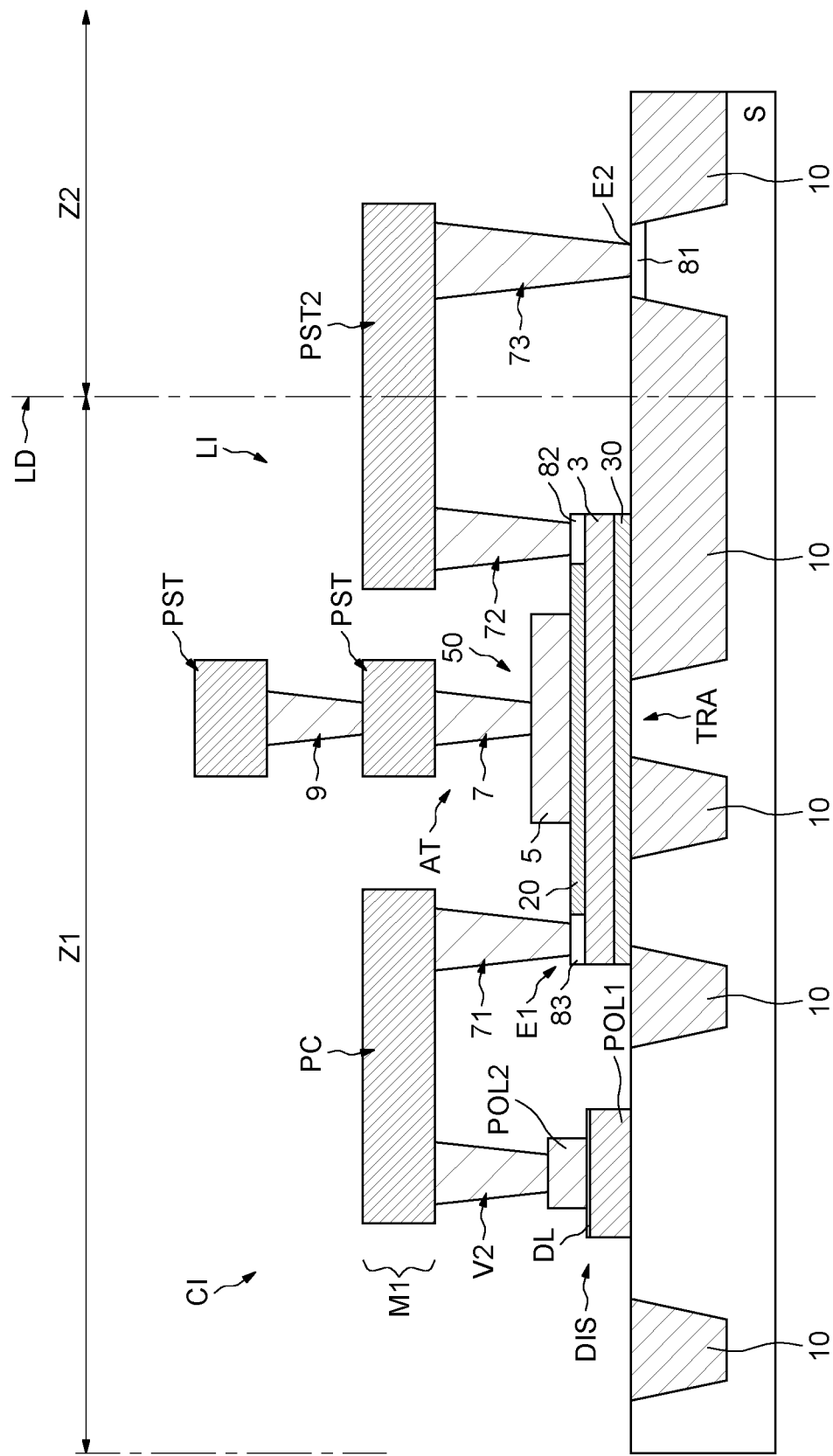
FIG. 2 shows an example of an integrated circuit.

FIG. 2 shows an example of an integrated circuit CI that is located in a first zone Z1 of a semiconductor wafer and is separated from a second zone Z2 of the wafer by a cutting path LD.

A substrate S of the wafer and of the integrated circuit comprises isolating regions 10, for example shallow trench isolations or a local oxide.

The circuit CI comprises, on its outer periphery, a sealing ring AT. This structure is advantageous because it provides sealtightness and hence allows the integrated circuit CI to be protected from the potential propagation of chips and splinters when cutting the wafer to allow the integrated circuits to be singulated.

Of course, the integrated circuit CI may comprise several sealing rings AT on its periphery, these being arranged side-by-side so as to bolster sealtightness and thus better protect the integrated circuit CI.

The sealing ring AT comprises here a contact 7 forming a wall and a first metal track PST that is located at a first metallization level M1 of an interconnect portion (known to those skilled in the art by the acronym BEOL for back end of line) of the integrated circuit CI.

On this same metal track PST that is located at the first metallization level M1, there rests a via wall 9 surmounted by a second metal track PST that is located at a second metallization level.

The sealing ring AT rests on a first polysilicon bar 5 that is itself arranged on a first dielectric layer 20, for example a silicon oxide layer or an oxide-nitride-oxide layer.

The dielectric layer 20 separates the first polysilicon bar 5 from a second polysilicon bar 3 that is itself separated from the substrate S by a second dielectric layer 30, for example a silicon oxide layer or an oxide-nitride-oxide layer.

This stack of polysilicon bars and of oxide layers crosses the contact wall 7 and extends to the periphery of the integrated circuit CI.

This crossing portion TRA constitutes a portion of an electrically conductive connecting element LI which therefore extends to the outside of the integrated circuit CI.

The electrically conductive connecting element LI extends between a first site E1 inside the integrated circuit CI and a second site E2 located outside the integrated circuit CI (in this case a site on the substrate that is located in zone Z2 of the wafer beyond the cutting line LD).

The connecting element LI also comprises a straddling portion PST2 that will straddle said cutting line LD. The straddling portion is located at the first metallization level M1.

Of course, it would be possible for it to extend to a higher metallization level.

The straddling portion PST2 is connected to the second location E2 by a contact 73 that is arranged on a first metal silicide layer 81. The straddling portion PST2 is connected to the second polycrystalline silicon bar 3 by the contact 72 that is arranged on a second metal silicide layer 82.

The first site E1 is connected to an electrically conductive body PC through a via 71 resting on a third metal silicide layer 83. The body PC is located here at the metallization level M1 but it could advantageously be located at a higher metallization level.

The electrically conductive body PC is coupled to said antifuse device DIS by the via or the control terminal V2.

The electrically conductive body PC may comprise an electrically conductive wafer.

The second site E2 thus connected to the substrate S by the first metal silicide layer 81 makes it possible, if the substrate S is kept grounded, to keep the first site E1 and hence the electrically conductive body PC grounded.

Specifically, this is particularly advantageous for shedding electric charge that might build up on the wafer PC during the production of the integrated circuit. The straddling portion PST2 of the connecting element LI will subsequently be cut through, thus conferring a discharged state on said body PC. The body PC becomes an electrically conductive body at a floating potential holding here an electrically zero initial amount of charge.

The example of a connecting element passing through the sealing ring is particularly advantageous because it allows the conductive body PC to be kept grounded while protecting the integrated circuit from the intrusion of interfering external elements. That being said, other configurations of the connecting element are possible without necessarily passing through the sealing ring. For example, it is possible to envisage a connection between an upper contact pad of the integrated circuit, connected to the conductive body and the second site E2, passing over the sealing ring AT.

Figure 3:
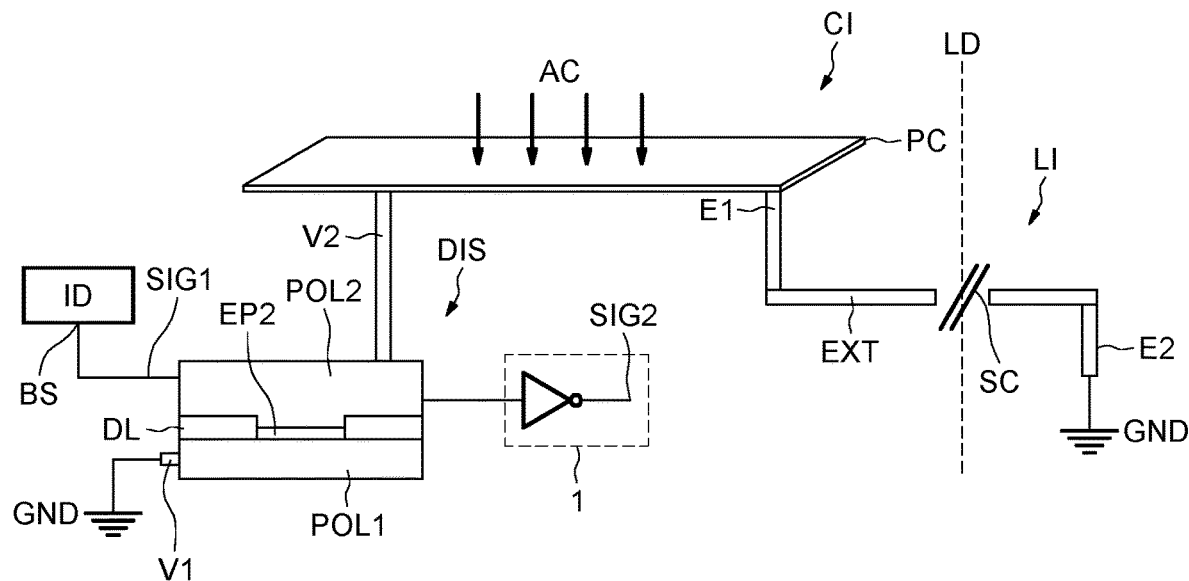
FIG. 3 is a simplified depiction of said integrated circuit.

FIG. 3 is a simplified depiction of said integrated circuit CI after cutting through SC the straddling portion PST2.

Now that the straddling portion PST2 has been cut through, the connecting element LI comprises a free end EXT that is located outside said sealing ring AT.

The term "free end" is understood to mean that there is no longer any contact between the integrated circuit CI and an external element.

The integrated circuit CI therefore comprises said electrically conductive body PC at a floating potential that is intended to receive electric charge AC during an electron beam attack, coupled to said antifuse device DIS by the control terminal V2.

The integrated circuit CI also comprises a module ID, for example a register, a memory or an electronic circuit, that is configured to transmit, via its output BS, data SIG1 to one or more other modules 1, for example another memory or a state machine of the integrated circuit. The output BS of the module ID is coupled to the antifuse device DIS by the second layer of polycrystalline silicon POL2, just like the module 1. Thus, the antifuse device DIS, and more particularly the second layer of polycrystalline silicon, is configured to transmit data SIG1 sent by the module ID to the inverter at the other module 1.

The antifuse device is also coupled to ground GND by the terminal V1 of the first layer of polycrystalline silicon POL1. The data SIG1 cannot go to ground since the dielectric layer DL separates the first layer of polycrystalline silicon POL1 and the second layer of polycrystalline silicon POL2 (the antifuse device is in its first state corresponding to an open circuit between the terminal V1 and the second layer POL2).

Figure 4:
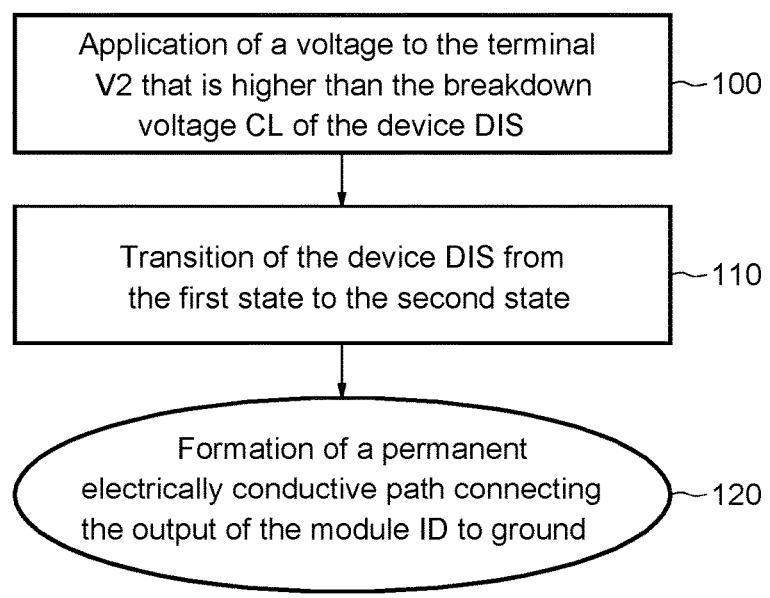
FIG. 4 illustrates a flow chart of a method.

FIG. 4 illustrates a flow chart of the method according to one implementation.

Step 100 comprises the application of a voltage to the terminal V2 resulting from a buildup of electric charge on said electrically conductive body PC.

If said voltage is lower than the breakdown voltage CL of the antifuse device DIS, the antifuse device remains in the first state corresponding to an open circuit. In other words, the data SIG1 from the module ID continue to be transmitted to the module 1 by passing through the second layer of polycrystalline silicon POL2.

If said voltage is higher than the breakdown voltage CL of the antifuse device DIS, the thinned portion DL2 becomes conductive, thereby causing the antifuse device DIS, in step 110, to transition from the first state corresponding to an open circuit to the second state corresponding to a closed circuit. Thus, this forms, in step 120, said permanent electrically conductive path between the first layer of polycrystalline silicon POL1 and the second layer of polycrystalline silicon POL2. The output BS of the module ID is therefore connected to ground, thereby making the data contained in or processed by the module ID inaccessible.

The invention claimed is:

1. A method for protecting a circuit module within an integrated circuit, comprising:
    collecting, at an electrically conductive body of the integrated circuit which is at a floating potential and holding an initial amount of electric charge, electric charge in response to an attack made on the integrated circuit; and
    forming a permanent electrically conductive path through an antifuse device between ground and an output of the circuit module in response to said electrically conductive body collecting electric charge with an amount that is different from said initial amount and higher than a threshold.

2. The method according to claim 1, further comprising:
    grounding said electrically conductive body of the integrated circuit via a connecting element during production of the integrated circuit in order to set the initial amount of electric charge; and
    cutting through the connecting element so as to confer a zero initial amount of charge on said electrically conductive body.

3. The method according to claim 1, further comprising electrically coupling a first terminal of the antifuse device to said electrically conductive body, said antifuse device being configured to transition irreversibly from a first state corresponding to an open circuit to a second state corresponding to a closed circuit if a voltage applied to said terminal and resulting from said collected amount of electric charge is higher than a breakdown voltage of said antifuse device, wherein forming the permanent electrically conductive path comprises transitioning of the antifuse device from the first state to the second state.

4. The method according to claim 3, further comprising coupling the output of the circuit module to the first terminal of the antifuse device and coupling a second terminal of the antifuse device to ground.

5. An integrated circuit, comprising:
    a circuit module;
    an electrically conductive body at a floating potential that is located in the integrated circuit and configured to hold an initial amount of electric charge; and
    a protection circuit configured to form a permanent electrically conductive path through an antifuse device between ground and an output of the circuit module in response to collection of an amount of electric charge on said electrically conductive body in response to an attack made on the integrated circuit that is different from the initial amount and higher than a threshold.

6. The integrated circuit according to claim 5, wherein the initial amount of electric charge is a zero amount of charge.

7. The integrated circuit according to claim 6, further comprising an electrically conductive connecting element having a first end that is electrically coupled to said electrically conductive body and a second, free end that extends outside the integrated circuit.

8. The integrated circuit according to claim 7, wherein the integrated circuit comprises at least one sealing ring, and wherein said electrically conductive connecting element passes through said at least one sealing ring such that the second, free end of the electrically conductive connecting element is located on an opposite side of said at least one sealing ring from said first end of the electrically conductive connecting element.

9. The integrated circuit according to claim 5, wherein the antifuse device has a terminal that is electrically coupled to said electrically conductive body, said antifuse device configured to transition irreversibly from a first state corresponding to an open circuit to a second state corresponding to a closed circuit if a voltage applied to said terminal and resulting from said collected amount of electric charge is higher than a breakdown voltage of said antifuse device, the antifuse device in the second state grounding the output of the circuit module through the permanent electrically conductive path.

10. The integrated circuit according to claim 9, wherein the antifuse device comprises, on a substrate, a first layer of polycrystalline silicon, a second layer of polycrystalline silicon, and a dielectric layer separating the first and second layers of polysilicon, said dielectric layer having a portion that is thinned with respect to a rest of the dielectric layer, the second layer of polycrystalline silicon including said terminal that is electrically coupled to said electrically conductive body.

11. The integrated circuit according to claim 5, wherein the electrically conductive body comprises an electrically conductive wafer.

12. The integrated circuit according to claim 5, wherein the output of the circuit module is electrically connected to a first terminal of the protection circuit, and wherein a second terminal of the protection circuit is electrically connected to ground, the integrated circuit including a further circuit module configured to process data from the circuit module, said data passing through the first terminal of the protection circuit.

13. A chip card electronic device including an integrated circuit, wherein the integrated circuit comprises:
    a circuit module;
    an electrically conductive body at a floating potential that is located in the integrated circuit and configured to hold an initial amount of electric charge; and
    a protection circuit configured to form a permanent electrically conductive path through an antifuse device between ground and an output of the circuit module in response to collection of an amount of electric charge on said electrically conductive body in response to an attack made on the integrated circuit that is different from the initial amount and higher than a threshold.

14. The chip card electronic device according to claim 13, wherein the circuit module stores sensitive data for the chip card electronic device.

15. The chip card electronic device according to claim 14, wherein the output of the circuit module is electrically connected to a first terminal of the protection circuit, and wherein a second terminal of the protection circuit is electrically connected to ground, and further including a further circuit module configured to process sensitive data from the circuit module, said sensitive data passing through the first terminal of the protection circuit.

16. The chip card electronic device according to claim 13, wherein the antifuse device has a terminal that is electrically coupled to said electrically conductive body, said antifuse device configured to transition irreversibly from a first state corresponding to an open circuit to a second state corresponding to a closed circuit if a voltage applied to said terminal and resulting from said collected amount of electric charge is higher than a breakdown voltage of said antifuse device, the antifuse device in the second state grounding the output of the circuit module through the permanent electrically conductive path.

17. The chip card electronic device according to claim 16, wherein the antifuse device comprises, on a substrate, a first layer of polycrystalline silicon, a second layer of polycrystalline silicon, and a dielectric layer separating the first and second layers of polysilicon, said dielectric layer having a portion that is thinned with respect to a rest of the dielectric layer, the second layer of polycrystalline silicon including said terminal that is electrically coupled to said electrically conductive body.

18. The chip card electronic device according to claim 13, wherein the initial amount of electric charge is a zero amount of charge.

19. The chip card electronic device according to claim 13, wherein the electrically conductive body comprises an electrically conductive wafer.

20. An integrated circuit, comprising:
    a circuit generating a signal at an output node;
    an electrically conductive body;
    an antifuse having a first terminal and a second terminal, wherein the first terminal is insulated from the second terminal by a dielectric layer;
    a ground node connected to the second terminal;
    a first direct electrical connection between the output node and the first terminal;
    a second direct electrical connection between the electrically conductive body and the first terminal;
    wherein the electrically conductive body, when the first terminal is insulated from the second terminal by the dielectric layer, is at a floating potential and configured to hold an initial amount of electric charge; and
    wherein a permanent conductive path is formed by breakdown across said dielectric layer to connect the output node to the ground node in response to collection of an amount of electric charge on said electrically conductive body in response to an attack made on the integrated circuit that is different from the initial amount and higher than a threshold set by the dielectric layer.

21. The integrated circuit according to claim 20, wherein the initial amount of electric charge is a zero amount of charge.

22. The integrated circuit according to claim 20, further comprising an electrically conductive connecting element having a first end that is electrically coupled to said electrically conductive body and a second, free end that extends outside the integrated circuit.

23. The integrated circuit according to claim 22, wherein the integrated circuit comprises at least one sealing ring, and wherein said electrically conductive connecting element passes through said at least one sealing ring such that the second, free end of the electrically conductive connecting element is located on an opposite side of said at least one sealing ring from said first end of the electrically conductive connecting element.

24. The integrated circuit according to claim 20, further comprising:
   a logic circuit having an input and an output; and
   a third direct electrical connection between the first terminal and the input of the logic circuit;
   wherein the input of the logic circuit receives the signal through the first direct electrical connection, the first terminal of the third direct electrical connection.

* * * * *